(12) United States Patent
Cox et al.

(10) Patent No.: US 10,147,676 B1
(45) Date of Patent: Dec. 4, 2018

(54) WAFER-SCALE POWER DELIVERY

(71) Applicant: International Business Machines Corporation, Armonk, NY (US)

(72) Inventors: Charles E. Cox, San Jose, CA (US); Harald Huels, Horb (DE); Arvind Kumar, Chappaqua, NY (US); Xiao Hu Liu, Briarcliff, NY (US); Ahmet S. Ozcan, San Jose, CA (US); Winfried W. Wilcke, Los Altos Hills, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/595,141

(22) Filed: May 15, 2017

(51) Int. Cl.
*H01L 21/44* (2006.01)
*H01L 23/34* (2006.01)
(Continued)

(52) U.S. Cl.
CPC ............ *H01L 23/50* (2013.01); *H01L 21/486* (2013.01); *H01L 21/4853* (2013.01); *H01L 23/49816* (2013.01); *H01L 23/49827* (2013.01); *H01L 23/49833* (2013.01); *H01L 24/16* (2013.01); *H01L 25/0655* (2013.01); *H01L 25/50* (2013.01); *H01L 2224/16235* (2013.01)

(58) Field of Classification Search
CPC ............... H01L 23/50; H01L 23/49816; H01L 23/49827; H01L 25/0655; H01L 25/0657; H01L 2021/60022; H01L 2021/60285; H01L 2021/603
USPC .......... 438/106–109, 612, 613; 257/726, 727
See application file for complete search history.

(56) References Cited

U.S. PATENT DOCUMENTS 4,042,374 A 8/1977 Rasmussen et al.
7,855,101 B2 12/2010 Furman et al.
(Continued)

FOREIGN PATENT DOCUMENTS

WO 8201145 A1 4/1982

OTHER PUBLICATIONS

L. Peng, et al., "Thermal Reliability of Fine Pitch Cu—Cu Bonding with Self Assembled Monolayer (SAM) Passivation for Wafer-on-Wafer 3D-Stacking," IEEE Electronic Components and Technology Conference, 2011, pp. 1-5.
(Continued)

*Primary Examiner* — Hsien Ming Lee
(74) *Attorney, Agent, or Firm* — Cantor Colburn LLP; Vazken Alexanian

(57) ABSTRACT

A method is provided to supply power to wafer-scale ICs. The method includes receiving a wafer containing ICs placed on the top of the wafer. The wafer has through-hole vias to provide power from the bottom to the ICs. The method also includes a printed circuit board, which has power rails in a pattern on the top of the printed circuit board, where the rails provide voltage and ground. The method continues with placing metal solder spheres between the bottom of the wafer and the top of the printed circuit board, where the spheres provide connections between the two, and where the spheres are free to move and operate as mechanical springs to resist clamping forces. The method also includes applying clamping pressure to the structure to establish connections by compressing the spheres, where no soldering is required.

20 Claims, 11 Drawing Sheets

(51) Int. Cl.
*H01L 23/50* (2006.01)
*H01L 23/498* (2006.01)
*H01L 23/00* (2006.01)
*H01L 25/065* (2006.01)
*H01L 25/00* (2006.01)
*H01L 21/48* (2006.01)

(56) References Cited

U.S. PATENT DOCUMENTS

| | | |
|---|---|---|
| 8,114,707 B2 | 2/2012 | Farooq et al. |
| 8,405,226 B2 | 3/2013 | Knickerbocker et al. |
| 8,518,741 B1 | 8/2013 | Lu et al. |
| 8,546,930 B2 | 10/2013 | Bakir et al. |
| 9,123,554 B2 | 9/2015 | Kuroda et al. |
| 9,129,935 B1 | 9/2015 | Chandrasekar et al. |
| 9,425,125 B2 | 8/2016 | Shen |
| 2013/0001770 A1 | 1/2013 | Liu |
| 2014/0154839 A1* | 6/2014 | Ahn .................. H01L 21/76898 438/109 |
| 2014/0299231 A1 | 10/2014 | Chu et al. |
| 2017/0022991 A1 | 1/2017 | Orzechowski et al. |

OTHER PUBLICATIONS

P. Batra, et al., "Three-Dimensional Wafer Stacking using Cu TSV integrated with 45nm high performance SOI-CMOS embedded DRAM Technology," IEEE, 2013, pp. 1-2.

Philip Pieters, et al., "3D Wafer Level Packaging Approach Towards Cost Effective Low Loss High Density 3D Stacking," IEEE 7th International Conference on Electronics Packaging Technology, 2006, pp. 1-4.

Simge Cinar, et al., "Mechanical Fracturing of Core-Shell Undercooled Metal Particles for Heat-Free Soldering," Nature.Com, Scientific Reports, 6:21864, Feb. 23, 2016, pp. 1-10.

Yazdani, Farhang. "A novel low cost, high performance and reliable silicon interposer." CustomIntegrated Circuits Conference (CICO), 2015 IEEE . IEEE, 2015.

* cited by examiner

US 10,147,676 B1

WAFER-SCALE POWER DELIVERY

BACKGROUND

The present invention relates in general to wafer scale power delivery systems, and more particularly, to fabrication methods and resulting semiconductor structures for wafer scale systems having improved thermal and mechanical stability characteristics.

A silicon wafer can have a width of about 300 millimeters (mm) and can contain 100-500 or more processors. A soldering process is typically employed in one or more operations of an integrated circuit (IC) fabrication process. The soldering process utilizes heat to facilitate the flow of solder which is used to mount various components. Following the fabrications operations, testing and verification of each individual IC is performed while the IC is still attached to the silicon wafer. The testing and verification processes are performed early in the manufacturing process in order to reduce cost and testing time.

SUMMARY

Embodiments are directed to a method for supplying electrical power to wafer-scale integrated circuits. The method includes receiving a silicon-based wafer, which includes a plurality of integrated circuits placed on a top surface of the wafer. An array of through-silicon vias, with a predetermined size and pitch, are present in the wafer to provide power conduits from a bottom surface to the top surface. The method further includes receiving a printed circuit board which includes a plurality of power rails that provide voltage and ground electrical connection paths. The power rails have a predetermined size and pitch and are aligned in a pattern on a top surface of the printed circuit board. The method further includes placing metal solder spheres, with a predetermined size and pitch, between the bottom surface of the wafer and the top surface of the printed circuit board, and forming a structure wherein the solder spheres provide electrical connections between the wafer and the printed circuit board. The solder spheres are free to move and operate as elastic members to resist clamping forces. The method further includes applying a clamping force to the structure to establish electrical connections between the wafer and the printed circuit board by compressing the solder spheres without requiring metallurgical bonding or soldering.

Embodiments are also directed to a structure to supply electrical power to wafer-scale integrated circuits. The structure includes a silicon-based wafer that includes a plurality of integrated circuits placed on a top surface of the wafer. The wafer further includes an array of through-silicon vias, with a predetermined size and pitch to provide power connections from a bottom surface to the top surface of the wafer. The structure further includes a printed circuit board which includes a plurality of power rails with a predetermined size and pitch and aligned in a pattern on a top surface of the printed circuit board. The power rails provide voltage and ground electrical connection paths. A plurality of metal solder spheres, with a predetermined size and pitch, are between the bottom surface of the wafer and the top surface of the printed circuit board. The solder spheres provide electrical connections between the wafer and the printed circuit board, and are free to move and operate as elastic members to resist clamping forces. A clamping device presses the wafer towards the printed circuit board to establish electrical connections by compressing the solder spheres such that no metallurgical bonding or soldering is required.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
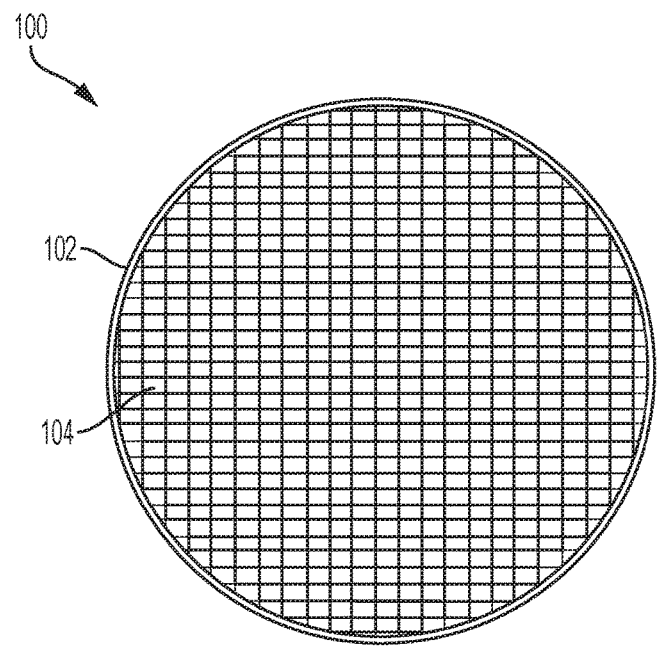
FIG. 1A depicts a logic wafer disk with high bandwidth memory ICs on the top surface according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, silicon wafers are typically thin structures. An IC typically includes a set of several electronic circuits on a single small flat piece (or "chip") of semiconductor material, e.g., a silicon (Si) wafer. It is not uncommon for a starting silicon wafer to have a thickness of 600 microns or less. In some instances, a grinding process is applied to the wafer, which further reduces the thickness to about 100 microns or less.

The soldering process used to form the ICs, which can apply thermal stresses to the silicon wafer which causes warpage. This manifests itself with the physical breakage of ICs and solder. Additionally, the silicon wafer is physically fragile and brittle and is subject to damage, including cracking, during routine handling. Conventional fabrication processes apply an organic laminate attached to the underside of the silicon wafer to add strength and provide electrical connections during the manufacturing process. However, the organic laminate has a different thermal expansion coefficient (CTE) than the silicon wafer. This difference can further contribute to warpage when the structure is subject to heating such as a soldering or deposition process. Therefore, adding an organic layer to the structure also adds a basic incompatibility between the silicon and organic layers.

Turning now to an overview of aspects of the present invention, embodiments of the invention address specific problems and limitations of using an organic or plastic laminate by supplying wafer-scale power delivery methods and structures using only silicon-based interconnection layers, through-silicon vias, and small bumps that require no heat-based soldering to establish electrical connections. By avoiding the use of organic or plastic layers, there is no CTE mismatch between materials, which avoids warpage. Also, through-silicon vias (TSVs) and bumps work without any significant voltage level drop because power can be supplied locally to ICs, typically in a vertical direction without significant lateral wiring. Aspects of the invention provide for a mechanically-stable solution, offers better heat conduction than an organic laminate, and provides better thermal conduction for more efficient cooling during operation.

Turning now to a more detailed description of embodiments of the present invention, FIG. 1A depicts a logic wafer disk 100 including a plurality of ICs 104 on a top wafer surface according to one or more embodiments of the present invention. In at least one embodiment, the logic wafer disk 100 includes a wafer disk 102 that is constructed of semiconductor material such as, for example, silicon (Si). The wafer disk 102 has a diameter of approximately 300 millimeters (mm), for example, and a thickness of approximately 100 microns (µm), for example. Dimensions are for descriptive purposes only and are not limiting, and other dimensions are possible.

Various types of ICs 104 can be formed on the upper surface of the wafer disk including, but not limited to, logic processors, discrete memory, or HBM IC chips. The ICs 104 can be mounted on the wafer disk 102 using a soldering process, for example. The ICs 104 on the logic wafer disk 100 are subject to a series of tests to validate proper functioning prior to a die cut process that releases the individual ICs 104. Any non-functional ICs are identified and later discarded. For the tests to be conducted, each IC 104 mounted onto the wafer disk 102 must be powered and capable of receiving and sending signals. Accordingly, the wafer disk 102 provides power and signal connections to the ICs 104 as described herein. For instance the wafer disk 102 includes one or more TSVs (not shown in FIG. 1), which provide power and signal connections from a first surface (e.g., bottom surface) of the wafer disk 102 to an opposing second surface (e.g., a top surface) of the wafer disk 102.

Figure 1B:
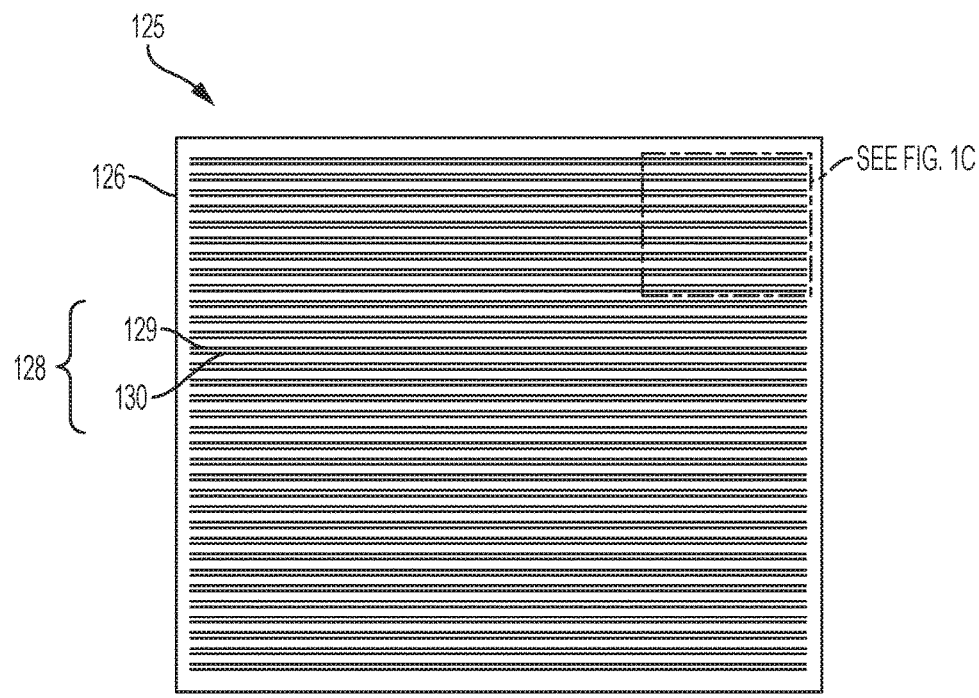
FIG. 1B depicts a printed circuit board assembly with an array of power rails according to one or more embodiments of the present invention.

Referring to FIG. 1B, a printed circuit board assembly (PCB)125 including an array of power rails is illustrated according to one or more embodiments of the present invention. The PCB 125 includes a composite board 126 that is physically larger than the logic wafer disk 100 of FIG. 1A. The PCB 125 also includes a plurality of power rails 128 arranged on the top surface of the PCB 125. The power rails 128 are approximately 1 mm in width, and can provide voltage and signal connections to various electronic devices (not shown in FIG. 1B). Each power rail 128 includes a voltage rail 129 and a ground rail 130. The power rails 128 provide power and ground connections to ICs 104 on the logic wafer disk 100 of FIG. 1A. In one or more embodiments, the PCB 125 includes a plurality of individual isolated power rails 128 to allow for multiple voltage connections along with either a common ground or multiple isolated ground connections. The voltage connections include, but are not limited to, a 1V connection, a 1.2V connection, and a 1.5V connection. In addition, the power rails 128 are dimensionally sized so as to accommodate multiple electrically conductive bumps (not shown in FIG. 1B) which are described greater detail below.

Figure 2:
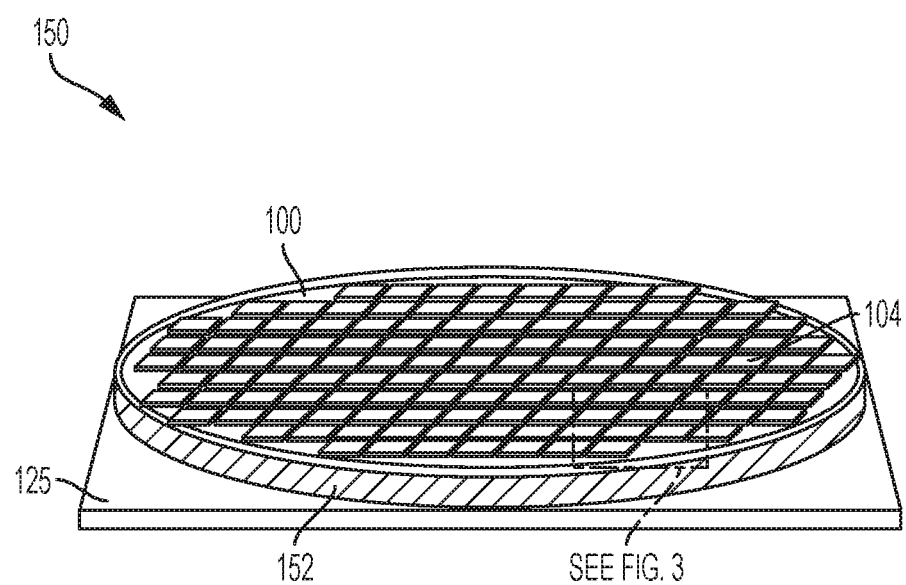
FIG. 2 depicts an oblique side view of a logic wafer/PCB assembly with ICs on the top surface of a printed circuit board according to one or more embodiments of the present invention.

Turning now to FIG. 2, an oblique side view of a logic wafer/PCB assembly 150 including HBM ICs on the top surface of a PCB 125 is illustrated according to one or more embodiments of the present invention. The logic wafer/PCB assembly 150 includes a logic wafer disk 100, a plurality of ICs 104, a PCB 125, and an interposer 152. The interposer 152 is a mechanical interface to the logic wafer disk 100 and is configured to ensure the mechanical strength of the logic wafer/PCB assembly 150. In addition, the interposer 152 can be formed along with a redistribution layer (described in FIG. 9), which is composed of single or multiple back-end wiring. Accordingly, the combination of the interpose 152 and the redistribution layer (not shown in FIG. 2) allows for flexible designs which overcomes restrictions caused by bump arrangement and TSV locations.

In some embodiments, the interposer 152 is omitted from the logic wafer/PCB assembly 150. When the interposer 152 is omitted, the logic wafer disk 100 itself is formed with a thickness capable of sustaining the mechanical stability of the logic wafer/PCB assembly 150. When omitting the interposer, the thickness of the logic wafer disk 100 is at least 300 microns thick. In addition, the logic wafer disk 100 must have TSVs for electrical connections. However, the lack of an interposer layer 152 can place restrictions on the layout and design of the ICs 104 when taking into account the need to form TSVs in the logic wafer/PCB assembly 150.

Figure 3A:
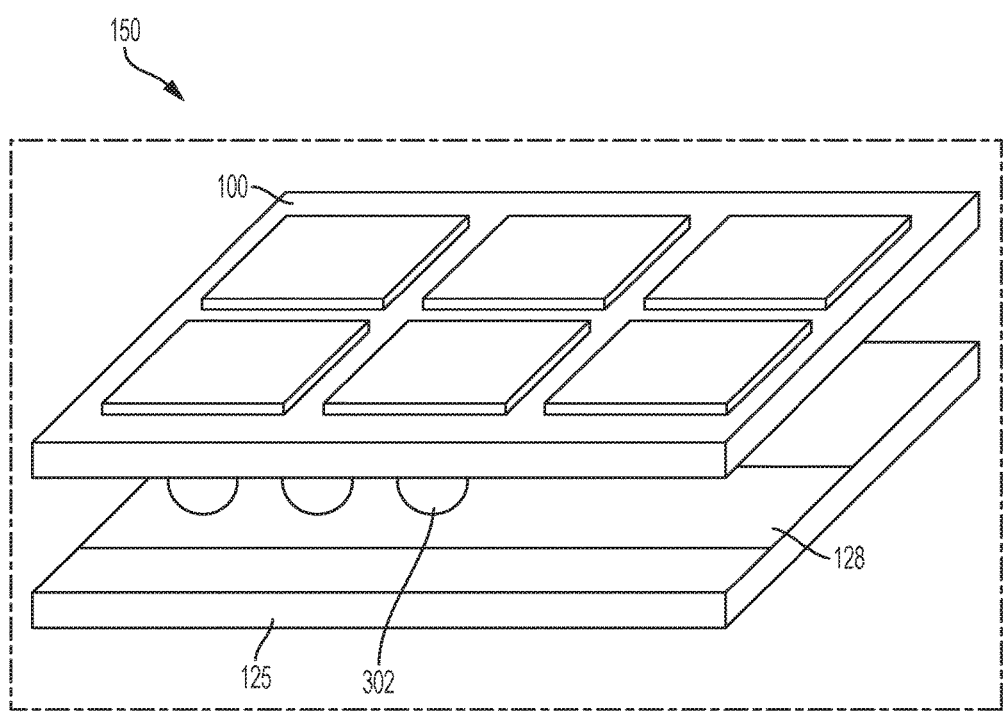
FIG. 3A depicts an enlarged oblique side view of logic wafer/PCB assembly described in FIG. 2 according to one or more embodiments of the present invention.

FIG. 3A depicts an enlarged oblique side view of logic wafer/PCB assembly 150 described in FIG. 2 according to one or more embodiments of the present invention. The logic wafer/PCB assembly 150 includes the logic wafer disk 100 of FIG. 1A, the PCB 125 with a power rail 128 (see FIG. 1B), and a plurality of bumps 302. The logic wafer disk 100 is electrically coupled to the PCB 125 using a plurality of bumps 302. The bumps 302 follow a controlled collapse chip connection (C4) commercial process to establish connections. The C4 process establishes an electrical connection between two layers and is a method for interconnecting semiconductor devices, such as IC chips and microelectromechanical systems (MEMS), to external circuitry with bumps that have been deposited onto IC pads. In the present invention, the bumps 302 are deposited onto the power rail 128 on the top surface of the PCB 125. In order to mount the logic wafer disk 100 to the PCB 125, the logic wafer disk 100 is flipped over so that its top surface faces down and aligned so that the logic wafer disk 100 TSVs, described in FIG. 5, align with a matching power rail 128 on the PCB 125. Next, bumps are applied to the power rail 128 of the PCB 125.

Figure 3B:
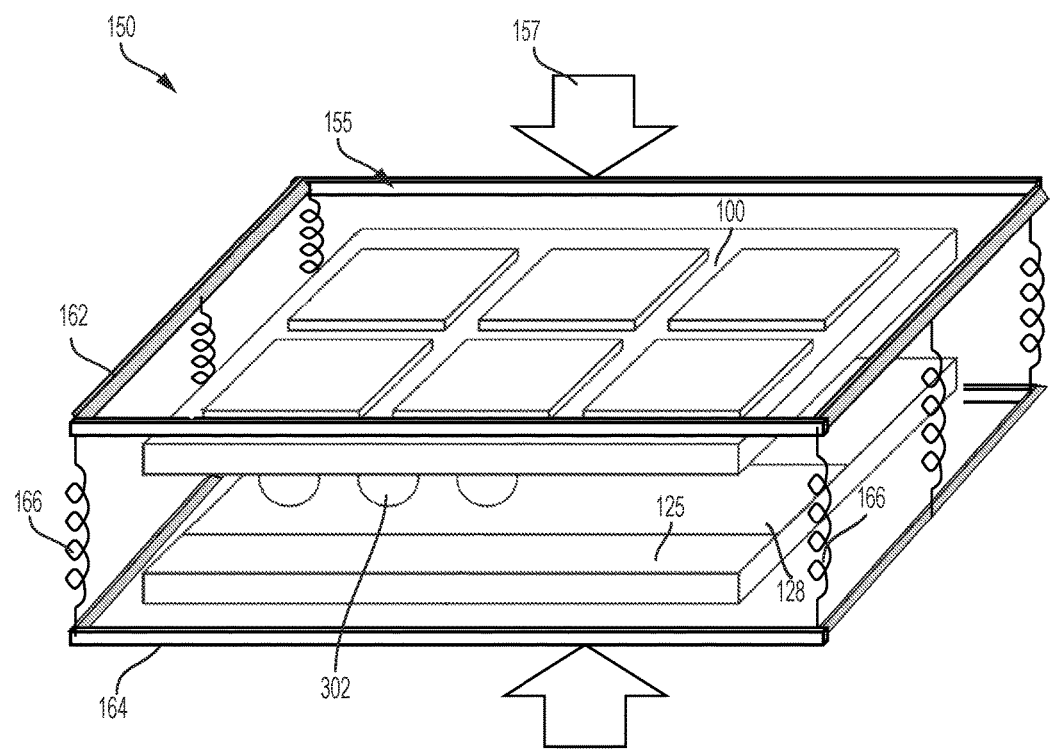
FIG. 3B depicts a clamping device that applies a clamping force to the logic wafer/PCB assembly illustrated in FIG. 3A.

Turning to FIG. 3B, the logic wafer disk 100 and PCB 125 are aligned and clamped together via a mechanical clamping device 155 to complete the interconnection to form a logic wafer/PCB assembly 150. In the present embodiment, the power rail 128 is approximately 1 mm wide, but this size is not limiting and other sizes (including dimension and pitch) are possible. The bumps 302 are of a smaller dimension and pitch than the power rail 128 and many bumps 302 are used to establish an electrical connection between the logic wafer disk 100 and the PCB 125.

A mechanical clamping device 155 applies a clamping force (indicated by block arrows 157) in a vertical direction to the logic wafer/PCB assembly 150. In one or more embodiments, the clamping device 155 includes a body 160 having an upper frame 162 and a base frame 164. The upper frame 162 contacts an upper surface of the wafer disk 100. One or more portions of the upper frame 162 are coupled to the base frame 164 via one or more elastic members such as a spring 166, for example. The springs 166 can be compressively biased such that the upper frame 162 is forced downward toward the base frame 164, and the bumps 302 located between the logic wafer/wiring wafer assembly and the PCB 125 are compressed. Accordingly, the bumps 302 are confined between the logic wafer disk 100 and the PCB 125. The clamping force foregoes the necessity of heating the materials and applying a traditional soldering process in order to establish an electrical connection.

Due to external mechanical forces and a difference in thermal expansion rates of the materials used in the logic wafer/PCB assembly 150, there can be mechanical movement of the logic wafer disk 100 in relation to the PCB 125. This movement can be in excess of 50 microns. As soldering is not required to establish an electrical connection, the bumps 302 are free to migrate or move in order to maintain an electrical connection between the logic wafer disk 100 and the PCB 125. The bumps 302 may also provide some elasticity and therefore can operate as elastic members themselves to withstand clamping forces applied by the clamping device 155. In other embodiments, the logic wafer disk 100, the PCB 125, and the bumps 302 have different sizes, dimensions, and pitch than each other. In addition, the logic wafer disk 100 can have different sizes, dimensions, and pitch on both the top and bottom surfaces in order to accommodate a multitude of different devices and ICs.

Figure 4:
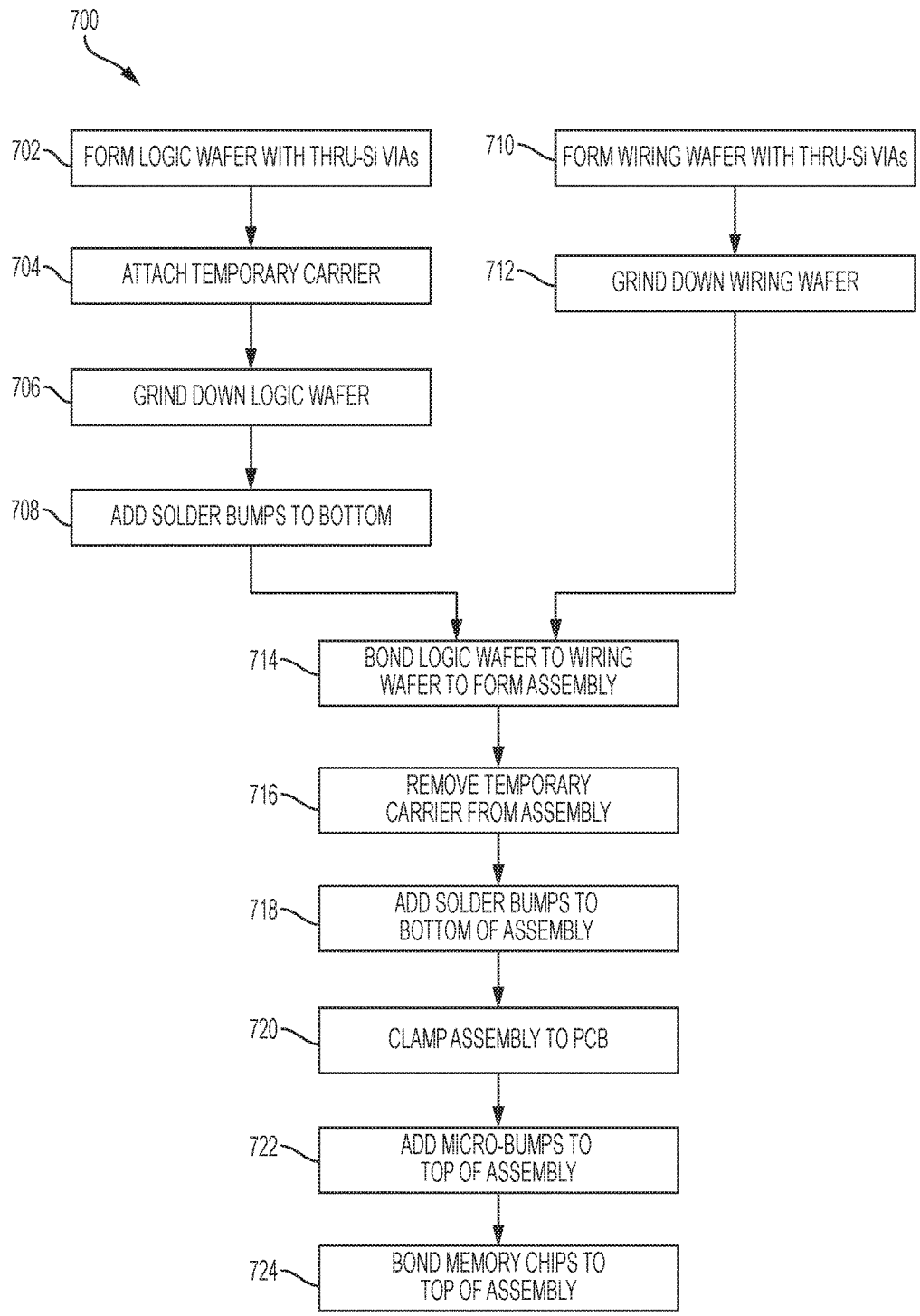
FIG. 4 depicts a flowchart of a method for forming a wafer-scale power delivery system according to one or more embodiments of the present invention.

A method for forming a wafer-scale power delivery system is described next. FIG. 4 depicts a flowchart of a method for forming a wafer-scale power delivery system 700 according to one or more embodiments of the present invention. The method includes forming a logic wafer containing TSVs at block 702. The method continues with attaching a temporary carrier layer to the top surface of the logic wafer at block 704 and grinding down the logic wafer to expose the TSVs at block 706. Next, the method continues with adding bumps to the bottom surface of the logic wafer at block 708, thus completing the fabrication of the logic wafer. Meanwhile, at block 710 a wiring wafer with TSVs is formed. The method continues with grinding down the wiring wafer in order to expose the TSVs at block 712, thus completing the fabrication of the wiring wafer.

The method for forming a wafer-scale power delivery system 700 continues with bonding the logic wafer to the wiring wafer using bumps and, in some embodiments, adding an underfill layer to form an assembly at block 714. The method continues with removing the temporary carrier that was added to the logic wafer at block 716, and adding bumps to the bottom of the wiring wafer at block 718. The method continues with attaching the logic wafer/wiring wafer assembly to a PCB and applying a clamping force via a mechanical clamping device 155 to compress the bumps located between the logic wafer/wiring wafer assembly and the PCB at block 720. In some embodiments, the method continues with adding micro-bumps, and optionally an underfill layer, to the top surface of the assembly at block 722, and adding memory chips or other ICs to the top surface of the assembly at block 724.

Figure 5:
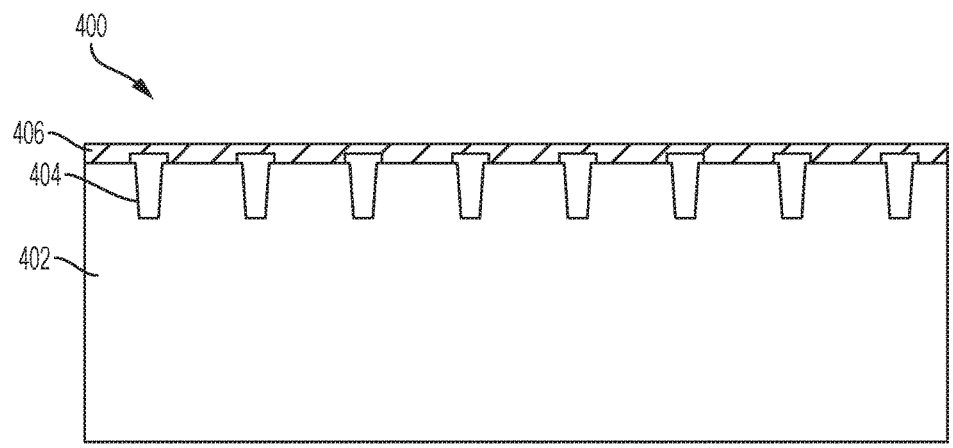
FIG. 5 depicts a full-thickness logic wafer assembly with TSVs according to one or more embodiments of the present invention.

FIG. 5 depicts a full-thickness logic wafer assembly 400 with through-silicon vias according to one or more embodiments of the present invention. The logic wafer assembly 400 includes a full thickness composite wafer layer 402 (wafer), a plurality of TSVs 404, and an logic device layer 406 for attaching ICs or other devices to the logic wafer assembly 400. The logic device layer 406 is formed using standard manufacturing methods but with the addition of TSVs 404. The top surface of the logic device layer 406 is a metal layer to which HBM ICs are attached. The TSVs 404 allow for an electrical pathway from the top surface to the bottom surface of the logic wafer assembly 400 once the fabrication process is complete. The TSVs 404 do not extend fully from the top surface to the bottom surface of the wafer 402. However, after a later grinding process, the TSVs 404 will extend fully from the top surface to the bottom surface of the wafer 402.

The logic device layer 406 is configured to support ICs or other devices. The top surface of the logic device layer 406 is a metal layer, for example, to which one or more ICs are attached. In one or more embodiments, the upper surface of the logic device layer 406 is configured to support one or more chips. The logic device layer 406 can also contain one or more electrically conductive redistribution layers (not shown). The redistribution layers are vertically arranged with respect to one another and are configured to provide lateral electrical conductivity or communication between multiple chips formed on the upper surface of the logic device layer 406. In one or more embodiments, a multitude of redistribution layers can be formed in the logic device layer 406 to form a high density wiring interface.

The TSVs 404 allow for an electrical pathway from a first surface (e.g., top surface) of the logic wafer 400 to an opposing second surface (e.g., bottom surface) of the logic wafer assembly 400 once the fabrication process is complete. Still referring to FIG. 5, the TSVs 404 do not extend fully from the top surface to the bottom surface of the wafer 402. However, after performing subsequent grinding process, the TSVs 404 will extend fully from the top surface to the bottom surface of the wafer 402 such that a surface of the TSVs 402 is accessible.

Figure 6:
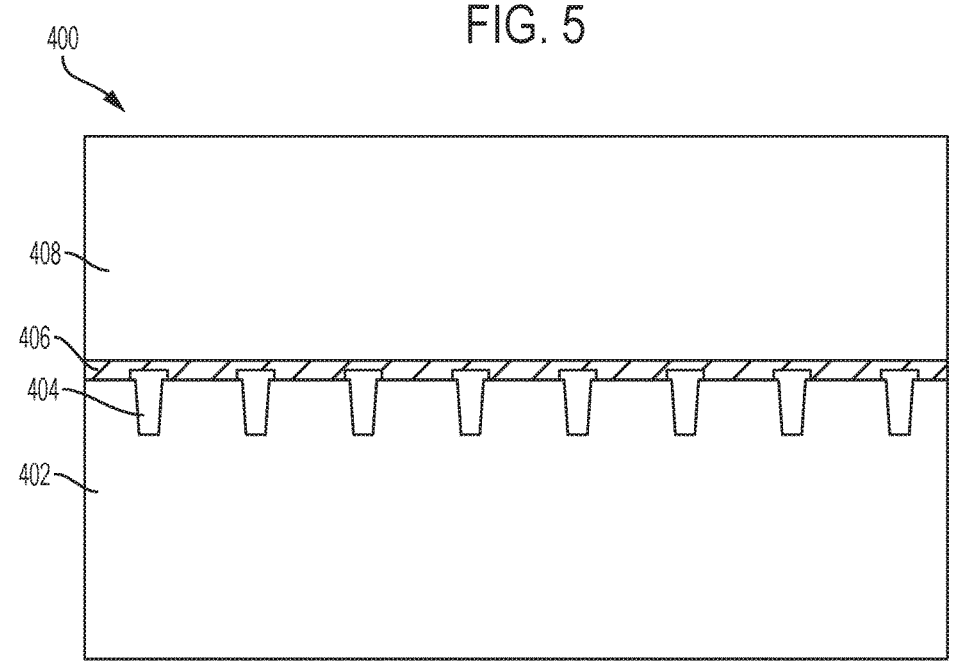
FIG. 6 depicts a temporary carrier layer attached to a logic wafer assembly according to one or more embodiments of the present invention.

FIG. 6 depicts a temporary carrier layer 408 attached to a logic wafer assembly 400 according to one or more embodiments of the present invention. The temporary carrier layer 408 (temporary carrier), also known as a handle wafer, is added to the top surface of the logic wafer assembly 400 (e.g., the upper surface of the logic device layer 406) to add mechanical strength to the assembly during the fabrication process. The temporary carrier 408 can be made of various materials including fiberglass, a composite material, or a Si-based derivative material. The temporary carrier 408 is fixably attached to the logic wafer assembly 400 using, but not limited to, an adhesive, a deposition process, or via mechanical fasteners.

Figure 7:
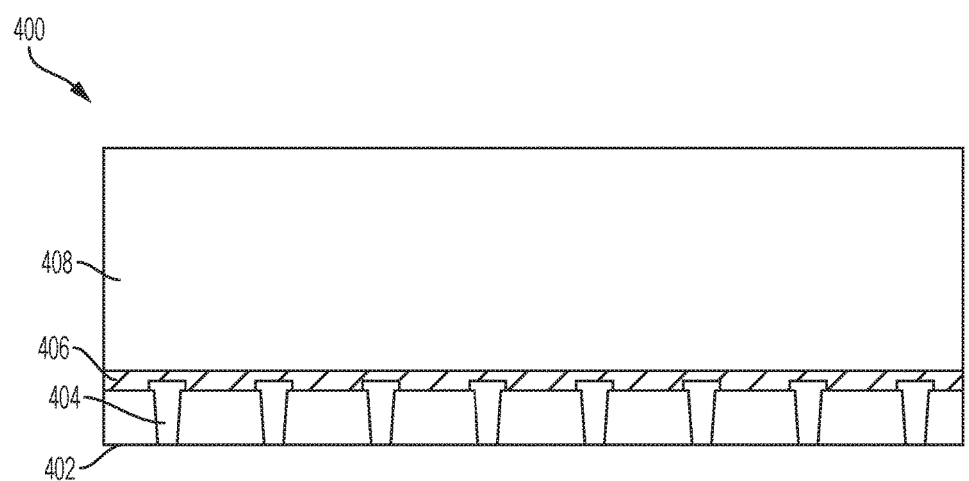
FIG. 7 depicts a logic wafer assembly after grinding according to one or more embodiments of the present invention.

FIG. 7 depicts a logic wafer assembly 400 after recessing the wafer 402 according to one or more embodiments of the present invention. In at least one embodiment, a grinding or thinning process is performed on the logic wafer assembly 400 of FIG. 6 to reduce the thickness of the wafer 402. The wafer thickness can be reduced, for example, to approximately 100 microns or less. In this manner, the grinding process exposes the TSVs 404 to the bottom surface of the wafer 402.

Figure 8:
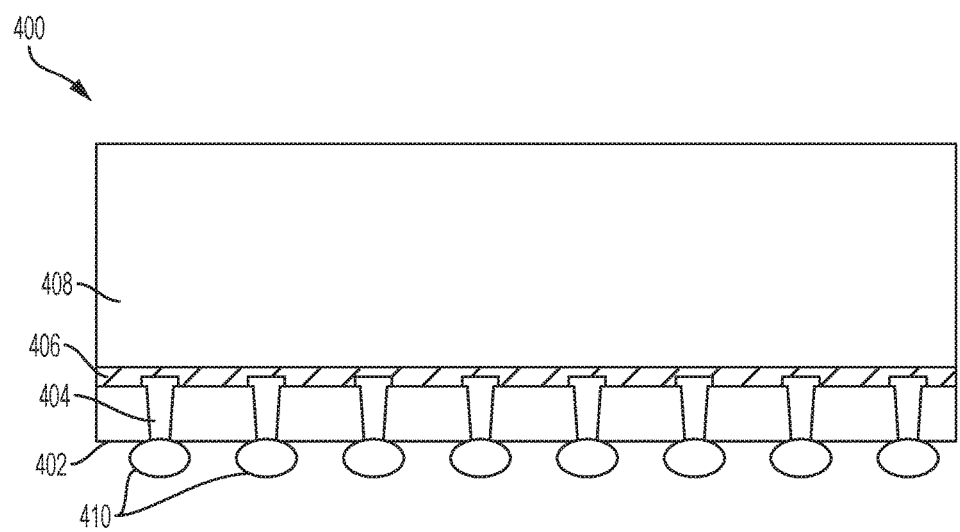
FIG. 8 depicts a logic wafer assembly after adding a plurality of solder balls according to one or more embodiments of the present invention.

FIG. 8 depicts a logic wafer assembly 400 after adding a plurality of bumps according to one or more embodiments of the present invention. A plurality of bumps 410 are added to the bottom surface of the logic wafer assembly 400. The bumps 410 are similar to the bumps 302 described in FIGS. 3A and 3B. Individual bumps 410 are approximately 100 microns or less in size and are usually smaller than the width of the power rail 128 of FIGS. 3A and 3B. The bumps 410 establish electrical contact with the TSVs 404 of the logic wafer assembly 400.

Figure 9:
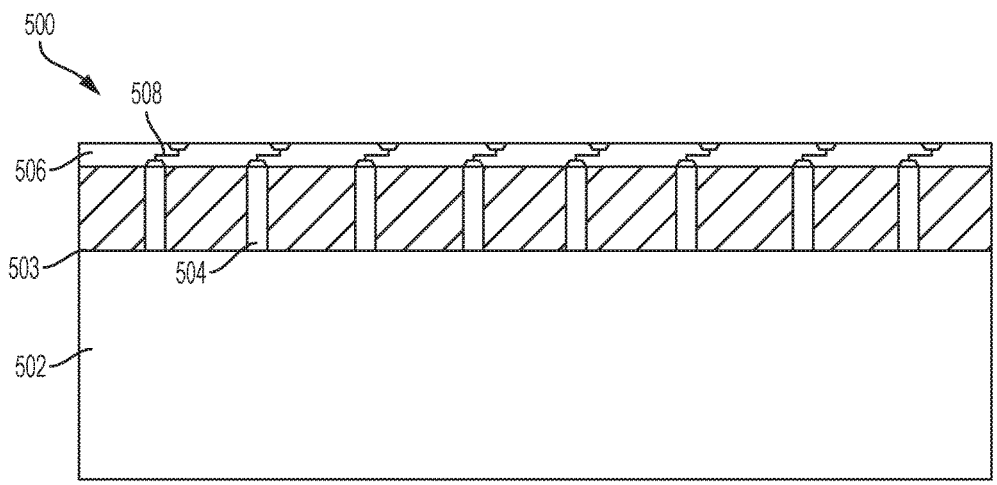
FIG. 9 depicts a wiring wafer assembly with TSVs and a metal layer according to one or more embodiments of the present invention.

FIG. 9 depicts a wiring wafer assembly 500 with 504 and a redistribution layer according to one or more embodiments of the present invention. Beginning now with a description of the wiring wafer assembly 500, the assembly 500 includes a full thickness wafer layer 502 (also referred to as a package substrate 502), a plurality of TSVs 504 extending from an upper surface of the full thickness wafer layer 502 to an intermediate portion 503 of the full thickness wafer layer 502, and a redistribution layer 506.

The redistribution layer 506 contains one or more metallization layers 508. In one or more non-limiting embodiments, and are configured to provide lateral electrical conductivity or communication. In one or more embodiments, the redistribution layer 506 is an interface between the TSVs 504 and electrically conductive the solder spheres 410 (e.g., bumps 410 of FIG. 8) that can be formed according to a subsequent fabrication process. In this manner, the redistribution layer 506 allows for a customized design which can accommodate different sizes and pitch of the logic wafer assembly 400 (of FIG. 8) and the wiring wafer assembly 500. In one or more embodiments, the wiring wafer assembly 500 is used as an interconnect layer between the logic wafer assembly 400 and the PCB, as described in greater detail below with respect to FIG. 14.

Figure 10:
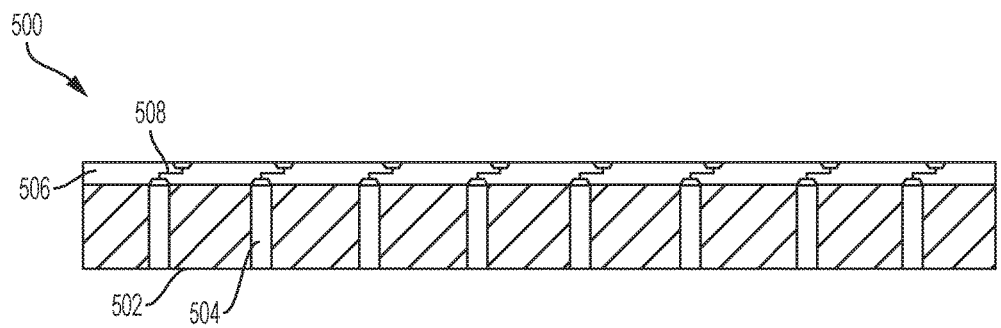
FIG. 10 depicts a wiring wafer assembly after thinning according to one or more embodiments of the present invention.

FIG. 10 depicts a wiring wafer assembly 500 after recessing the full thickness wafer layer 502 according to one or more embodiments of the present invention. In one example, the wiring wafer assembly 500 can undergo a grinding process such that the full thickness wafer layer 502 is thinned to approximately 250-350 microns in a grinding or thinning process. At this thickness, the wiring wafer assembly 500 is mechanically rigid and sufficiently strong to endure handling throughout the manufacturing process. Once the wiring wafer assembly 500 is thinned, the TSVs 504 are exposed on the bottom surface of the wiring wafer assembly 500.

Figure 11:
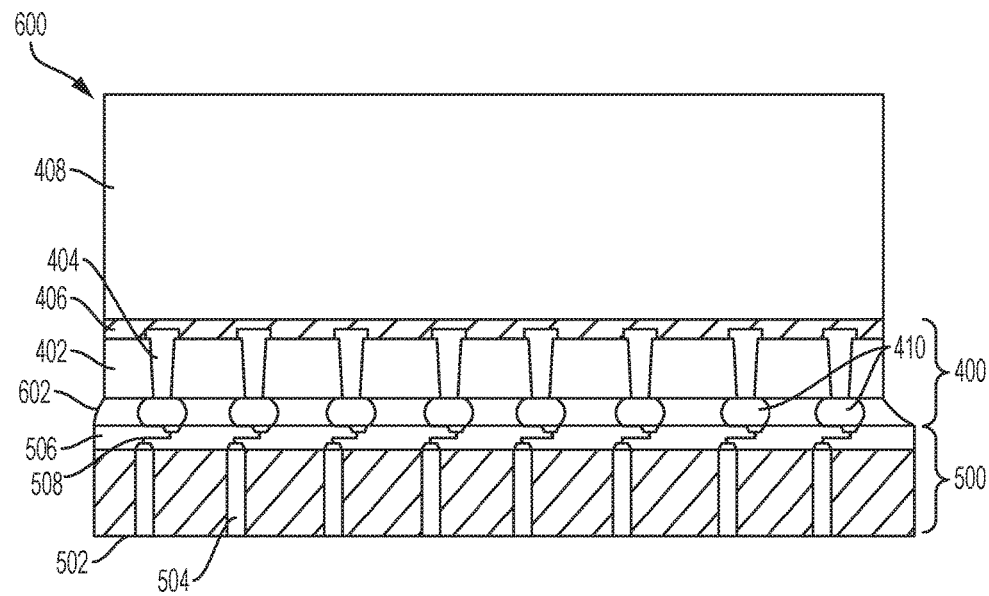
FIG. 11 depicts a temporary carrier/logic wafer and a wiring wafer assembly according to one or more embodiments of the present invention.

FIG. 11 depicts a temporary carrier/logic wafer and a wiring wafer assembly 600 (logic/wiring assembly) according to one or more embodiments of the present invention. The logic/wiring assembly 600 includes the logic wafer assembly 400 of FIG. 8 in electrical communication with the wiring wafer assembly 500 of FIG. 10 via a second plurality of electrically conductive bumps 410. The redistribution layer 506 allows for flexibility in design. For instance, one or more embodiments include vias 404 and first bumps 410 that have a different size and pitch with respect to vias 504. The redistribution layer 506, however, allows for lateral connectivity that improves the flexibility of connection between the logic wafer assembly 400 and the wiring wafer assembly 500.

The assembly further includes a first underfill layer 602 that is located between the two assemblies 400, 500 and fills the voids (not shown) that existed around the bumps 410. The material used to form the first underfill layer 602 includes, but is not limited to, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or a suitable underfill compound. The first underfill layer 602 enhances bonding of the two assemblies 400, 500 and creates a more mechanically strong logic/wiring assembly 600. However, the addition of the first underfill layer 602 hinders movement of the bumps 410 in conditions where the assemblies 400 and 500 move in relation to each other. In some embodiments, the first underfill layer 602 is optional.

Figure 12:
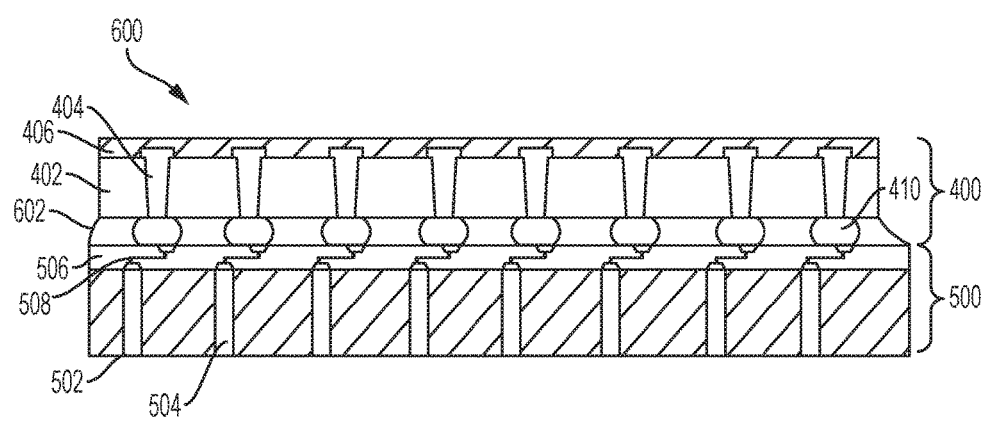
FIG. 12 depicts a logic/wiring assembly after removal of the temporary carrier according to one or more embodiments of the present invention.

FIG. 12 depicts a logic/wiring assembly 600 after removal of the temporary carrier 408 according to one or more embodiments of the present invention. With the joining of the logic wafer assembly 400 to the wiring wafer assembly 500, the resultant logic/wiring assembly 600 is sufficiently strong enough to endure manufacturing and handling stresses and the temporary carrier 408 is no longer required. As further illustrated in FIG. 12, the temporary carrier 408 is removed from the upper surface of the logic wafer assembly 400. Various processes can be performed to remove the temporary carrier 408. For example, a grinding or thinning process can be performed to remove the temporary carrier 408. Following removal of the temporary carrier 408, the logic/wiring assembly 600 can have a thickness ranging, for example, from approximately 300 microns to approximately 500 microns.

Figure 13:
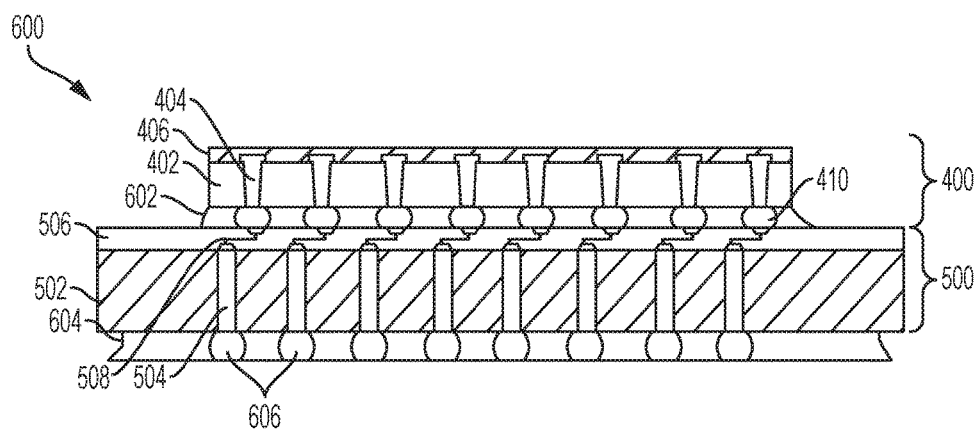
FIG. 13 depicts a logic/wiring assembly after the addition of bumps to the bottom surface of the wiring wafer according to one or more embodiments of the present invention.

FIG. 13 depicts a logic/wiring assembly 600 after forming a plurality of second electrically conductive bumps 606 to the bottom surface of the wiring wafer according to one or more embodiments of the present invention. The second bumps 606 are similar in material to the bumps 410 as described in FIG. 8. The second bumps 606 can have the same pitch or a different pitch and size as the first bumps 410 shown in FIG. 8. In at least some embodiments, a second underfill layer 604 is added around the second bumps 606 in a similar process as described in FIG. 11. The second underfill layer 604 can be composed of material similar to that of the first underfill layer 602 described above.

Figure 14:
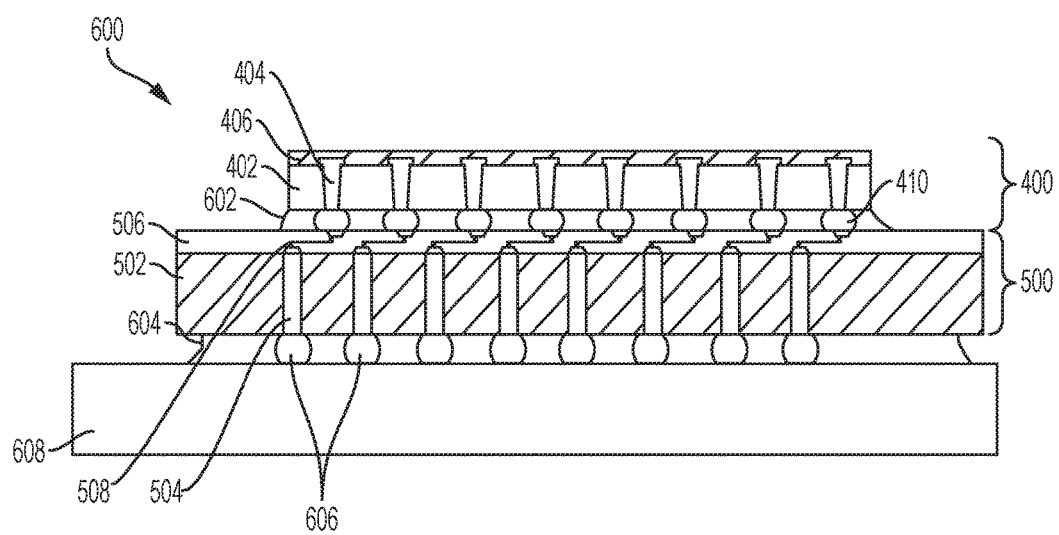
FIG. 14 depicts a logic/wiring assembly with the addition of a printed circuit board according to one or more embodiments of the present invention.

FIG. 14 depicts a logic/wiring assembly 600 with the addition of a printed circuit board 608 according to one or more embodiments of the present invention. The PCB 608 can be a full size circuit board or a small tile. The PCB 608 provides power and signal connections for the logic/wiring assembly 600 to include at least one voltage and ground connection. In some embodiments, the PCB 608 can include several discrete voltage and ground lines in order to supply multiple voltages to logic/wiring assembly 600.

Figure 15:
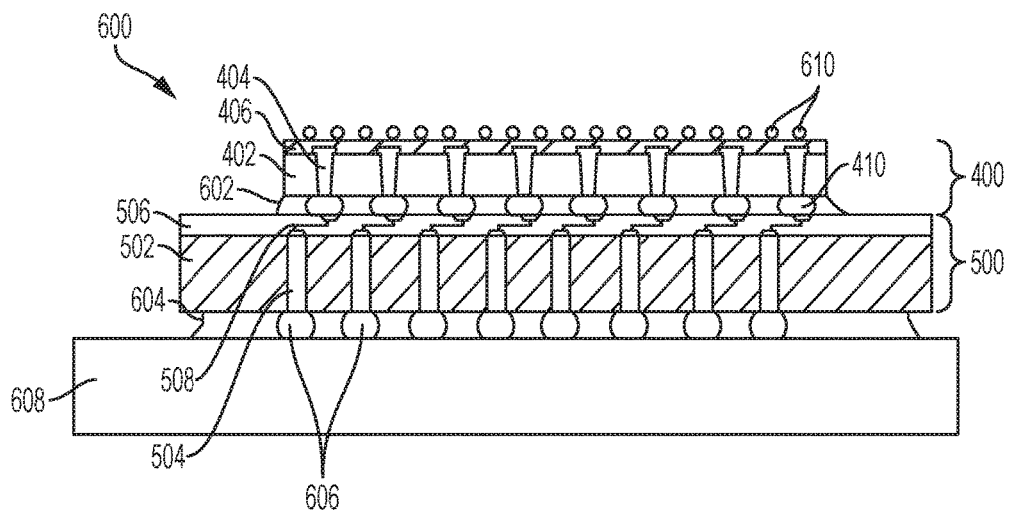
FIG. 15 depicts a logic/wiring assembly after the addition of solder micro-balls to the top surface according to one or more embodiments of the present invention.

FIG. 15 depicts a logic/wiring assembly 600 after the addition of solder micro-balls to the top surface according to one or more embodiments of the present invention. In at least one embodiment, solder micro-balls 610 (micro-bumps) are added to the logic/wiring assembly 600 to provide electrical connections to an additional layer of memory chips or other IC devices. The micro-bumps 610 are high-density and can be the same or different size and pitch as the bumps 606 of FIG. 13.

Figure 16:
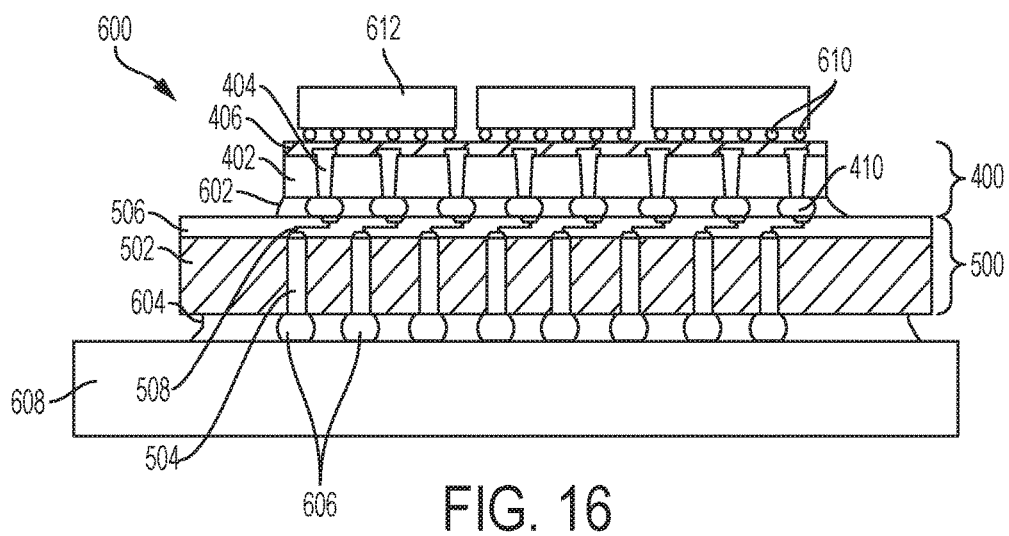
FIG. 16 depicts a completed logic/wiring assembly after the addition of memory chips to the top surface according to one or more embodiments of the present invention.

FIG. 16 depicts a completed logic/wiring assembly 600 after the addition of memory chips 612 to the top surface according to one or more embodiments of the present invention. The memory chips 612 are coupled to the logic device layer 406 via the micro-bumps 610. In at least one alternate embodiment, logic devices or other ICs are added to the top surface of the logic/wiring assembly 600. In one or more embodiments, the 406 contains a multitude of redistribution layers formed therein. In this manner, the logic device layer 406 is configured as a high-density wiring interface that electrically connects connect the top surface of the logic/wiring assembly 600 (e.g., the upper surface the wafer layer 402 and the first TSVs 404) to the memory chips 612 by using micro-bumps 610 as described in FIG. 15.

As illustrated in FIG. 16, a logic/wiring assembly 600 such as a wafer scale power system, for example, is provided which electrically connects a PCB 608, along with one or more wafers (e.g., 502 and 402), to one or more electrical devices such as, for example, memory chips 612 without implementing an organic laminate layer. The logic/wiring assembly 600 still has a high mechanical strength, but eliminates different thermal expansion coefficient (CTE) differential between the organic laminate layer and the silicon wafer which exists in conventional logic/wiring assemblies and wafer scale power systems. In this manner, the logic/wiring assembly 600 withstands deformation and degradation such as warping, for example, when exposed to high heat fabrication processes such as soldering and/or various material deposition processes.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in a flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for supplying electrical power to wafer-scale integrated circuits, the method comprising:
   receiving a silicon-based wafer, wherein the wafer includes a plurality of integrated circuits placed on a top surface of the wafer, and wherein an array of through-silicon vias, with a predetermined size and pitch, are present in the wafer to provide power conduits from a bottom surface to the top surface of the wafer;
   receiving a printed circuit board, which includes a plurality of power rails with a predetermined size and pitch and aligned in a pattern on a top surface of the printed circuit board, wherein the power rails provide voltage and ground electrical connection paths;
   placing a plurality of electrically conductive solder spheres, with a predetermined size and pitch, between the bottom surface of the wafer and the top surface of the printed circuit board, forming a structure wherein the plurality of electrically conductive solder spheres provide electrical connections between the wafer and the printed circuit board, and wherein the plurality of electrically conductive solder spheres are free to move and operate as mechanical springs to resist clamping forces; and
   applying clamping force to the structure to establish electrical connections between the wafer and the printed circuit board by compressing the plurality of electrically conductive solder spheres such that no metallurgical bonding or soldering is required.

2. The method of claim 1, wherein the power rails and the plurality of electrically conductive solder spheres have the same size and pitch.

3. The method of claim 1, wherein the power rails and the plurality of electrically conductive solder spheres have different sizes and pitch, and wherein the plurality of electrically conductive solder spheres are dimensionally smaller than the power rails to ensure multiple spheres are present to ensure multiple electrical connections.

4. The method of claim 1, further comprising forming a lateral electrical connection between a first through-silicon via among the array of through-silicon vias and a first solder sphere among the plurality of electrically conductive solder spheres, the first solder sphere being vertically offset with respect to the first through-hole via.

5. The method of claim 1, wherein the power rails includes at least one of isolated power lines to provide voltage connections and isolated ground lines to provide ground connections.

6. The method of claim 1, wherein the power rails includes signal lines to establish signal busses between the wafer and the printed circuit board.

7. The method of claim 1 further comprising:
   a metalized layer on the top surface of the wafer;
   a second plurality of solder spheres on an upper surface of the metalized layer; and
   an additional wafer on the second plurality of solder spheres to allow top surface electrical connections between the metalized layer and the additional wafer.

8. The method of claim 1, wherein the size and pitch of the power rails is larger than the size and pitch of the through-silicon vias of the wafer to allow for thermal expansion and misalignment errors.

9. The method of claim 1, wherein the plurality of electrically conductive solder spheres have a diameter no greater than 100 microns.

10. A structure for supplying electrical power to wafer-scale integrated circuits, the structure comprising:
    a silicon-based wafer, wherein the wafer includes a plurality of integrated circuits placed on a top surface of the wafer, and wherein an array of through-silicon vias, with a predetermined size and pitch, are present in the wafer to provide power connections from a bottom surface to the top surface of the wafer;
    a printed circuit board, which includes a plurality of power rails with a predetermined size and pitch and aligned in a pattern on a top surface of the printed circuit board, wherein the power rails provide voltage and ground electrical connection paths;
    a first plurality of electrically conductive solder spheres, with a predetermined size and pitch, between the bottom surface of the wafer and the top surface of the printed circuit board, wherein the first plurality of electrically conductive solder spheres provide electrical connections between the wafer and the printed circuit board, and wherein the first plurality of electrically conductive solder spheres are free to move and operate as mechanical springs to resist clamping forces; and
    a clamping device that presses the wafer towards the printed circuit board to establish electrical connections by compressing the first plurality of electrically conductive solder spheres such that no metallurgical bonding or soldering is required.

11. The structure of claim 10, wherein the power rails and the first plurality of electrically conductive solder spheres have the same size and pitch.

12. The structure of claim 10, wherein the power rails includes at least one of isolated power lines to provide voltage connections and isolated ground lines to provide ground connections.

13. The structure of claim 10, wherein the power rails and the first plurality of electrically conductive solder spheres have different sizes and pitch, and wherein the first plurality of electrically conductive solder spheres are dimensionally smaller than the power rail.

14. The structure of claim 10, wherein the first plurality of electrically conductive solder spheres are vertically offset with respect to the array of through-hole vias.

15. The structure of claim 14, further comprising a redistribution layer containing at least one metallization layer to provide lateral electrical conductivity from the through-silicon vias to the first plurality of electrically conductive solder spheres.

16. The structure of claim 10, wherein the power rails include signal lines to establish signal busses between the wafer and the printed circuit board.

17. The structure of claim 10 further comprising:
    a metalized layer on the top surface of the wafer;
    a second plurality of solder spheres on an upper surface of the metalized layer; and
    additional wafer layers on the second plurality of solder spheres to establish electrical connection between the metalized layer and the additional wafer layers.

18. The structure of claim 10, wherein the size and pitch of the power rails board is larger than the size and pitch of the through-silicon vias of the wafer to allow for thermal expansion and misalignment errors.

19. The structure of claim 10, wherein the first plurality of electrically conductive solder spheres are have a diameter no greater than 100 microns.

20. The structure of claim 10, further comprising an underfill layer placed between the first plurality of electrically conductive solder spheres.

* * * * *